(12) United States Patent
Jang (10) Patent No.: US 9,602,094 B2
(45) Date of Patent: Mar. 21, 2017

(54) DECODING CIRCUIT AND METHOD OF DECODING SIGNAL

(71) Applicant: SK hynix Inc., Gyeonggi-do (KR)

(72) Inventor: Dong-Wook Jang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/713,854

(22) Filed: May 15, 2015

(65) Prior Publication Data

US 2016/0226475 A1 Aug. 4, 2016

(30) Foreign Application Priority Data

Feb. 2, 2015 (KR) ........................ 10-2015-0015911

(51) Int. Cl.
*H03D 3/00* (2006.01)
*H03K 9/08* (2006.01)
*H03D 3/04* (2006.01)
*H03D 3/20* (2006.01)
*H03L 7/099* (2006.01)

(52) U.S. Cl.
CPC ............... *H03K 9/08* (2013.01); *H03D 3/00* (2013.01); *H03D 3/006* (2013.01); *H03D 3/007* (2013.01); *H03D 3/04* (2013.01); *H03D 3/20* (2013.01); *H03L 7/0992* (2013.01)

(58) Field of Classification Search
CPC .......... H03D 3/007; H03D 3/006; H03D 3/20; H03D 2200/0039; H03D 3/04; H03D 3/00; H04H 1/00

USPC .......... 327/141, 160; 329/325, 50, 310, 304; 375/333, 324

See application file for complete search history.

(56) References Cited

U.S. PATENT DOCUMENTS

| 4,804,925 A * | 2/1989 | Iwase ................. G11B 20/1419 329/310 |
| 7,801,261 B2 * | 9/2010 | Chakravarthy ....... H03L 7/0992 327/141 |
| 2013/0187708 A1 | 7/2013 | Dang et al. | |

FOREIGN PATENT DOCUMENTS

KR 100727409 6/2007

* cited by examiner

*Primary Examiner* — Arnold Kinkead
(74) *Attorney, Agent, or Firm* — IP & T Group LLP (57) ABSTRACT

A decoding circuit may include a section information generation unit suitable for generating section information corresponding to a section in which an input signal has a first value, a period information generation unit suitable for generating period information corresponding to a period of the input signal, a reference information generation unit suitable for generating reference information by dividing a value of the period information by a given value, and a comparison unit suitable for determining a logic value of the input signal by comparing the section information with the reference information.

18 Claims, 7 Drawing Sheets

DECODING CIRCUIT AND METHOD OF DECODING SIGNAL

CROSS-REFERENCE TO RELATED APPLICATIONS

The present application claims priority of Korean Patent Application No. 10-2015-0015911, filed on Feb. 2, 2015, which is incorporated herein by reference in its entirety.

BACKGROUND

1. Field

Exemplary embodiments of the present invention relate to a decoding circuit and a method of decoding a signal.

2. Description of the Related Art

Pulse width modulation (PWM) is a method of modulating the pulse width of a transmission signal (hereinafter called a "PWM signal") according to a logic value of "0" or "1". The PWM signal periodically switches between a low level and a high level. A rising or falling edge of the PWM signal may be controlled based on the logic value of data transferred through the PWM signal.

Figure 1A:
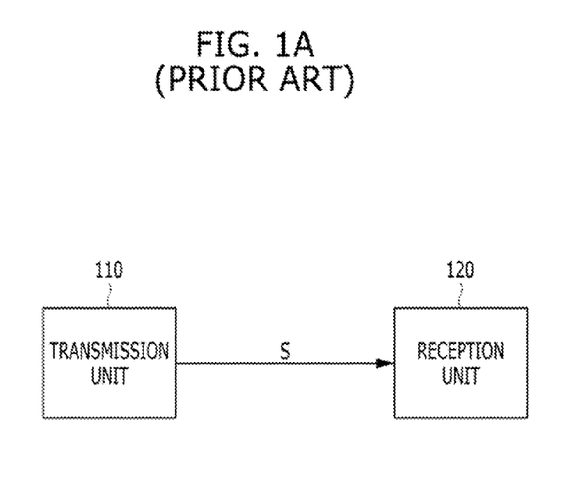
FIGS. 1A and 1B are a block diagram and a waveform diagram illustrating a method of sending and receiving signals using PWM.
Figure 1B:
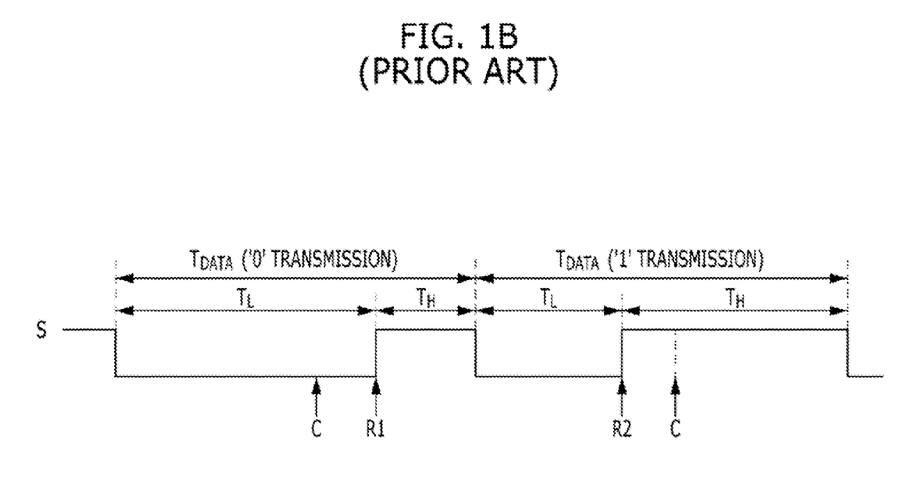

FIGS. 1A and 1B are respectively a block diagram and a waveform diagram illustrating a method of sending and receiving signals using PWM.

Referring to FIG. 1A, a PWM signal S is transmitted from a transmission unit 110 to a reception unit 120. Referring to FIG. 1B, a rising edge of the PWM signal S changes based on a logic value of data to be transmitted. A section $T_{DATA}$ denotes a period in which 1-bit data is transmitted in the PWM signal S. A position of the rising edge of the PWM signal S is determined based on the logic value of data to be transmitted.

When data "0" is to be transmitted, a low level section $T_L$ is shorter than a high level section $T_H$. When data "1" is to be transmitted, a high level section $T_H$ is longer than a low level section $T_L$. That is, when data "0" is to be transmitted, a rising edge R1 is placed behind a middle point C of the section $T_{DATA}$ in which the data "0" is transmitted. When data "1" is to be transmitted, a rising edge R2 is placed ahead of the middle point C of the section $T_{DATA}$ in which the data "1" is transmitted. When the transmission unit 110 sends the PWM signal S as described above, the reception unit 120 may receive the PWM signal S and convert it into a digital value.

When the reception unit 120 converts the PWM signal S into an accurate digital value using a PWM method, it is important to accurately detect the position of the rising edge.

SUMMARY

Various embodiments are directed to a decoding circuit for improving decoding accuracy by directly measuring a period of an input signal to decode the input signal, and a method of decoding a signal.

In an embodiment, a decoding circuit may include a section information generation unit suitable for generating section information corresponding to a section in which an input signal has a first value, a period information generation unit suitable for generating period information corresponding to a period of the input signal, a reference information generation unit suitable for generating reference information by dividing a value of the period information by a given value, and a comparison unit suitable for determining a logic value of the input signal by comparing the section information with the reference information.

In an embodiment, a method of decoding a signal may include generating period information corresponding to a period of an input signal, generating reference information by dividing a value of the period information by a given value, generating section information corresponding to a section in which the input signal has a first value, and determining a logic value of the input signal by comparing the section information with the reference information.

DETAILED DESCRIPTION

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
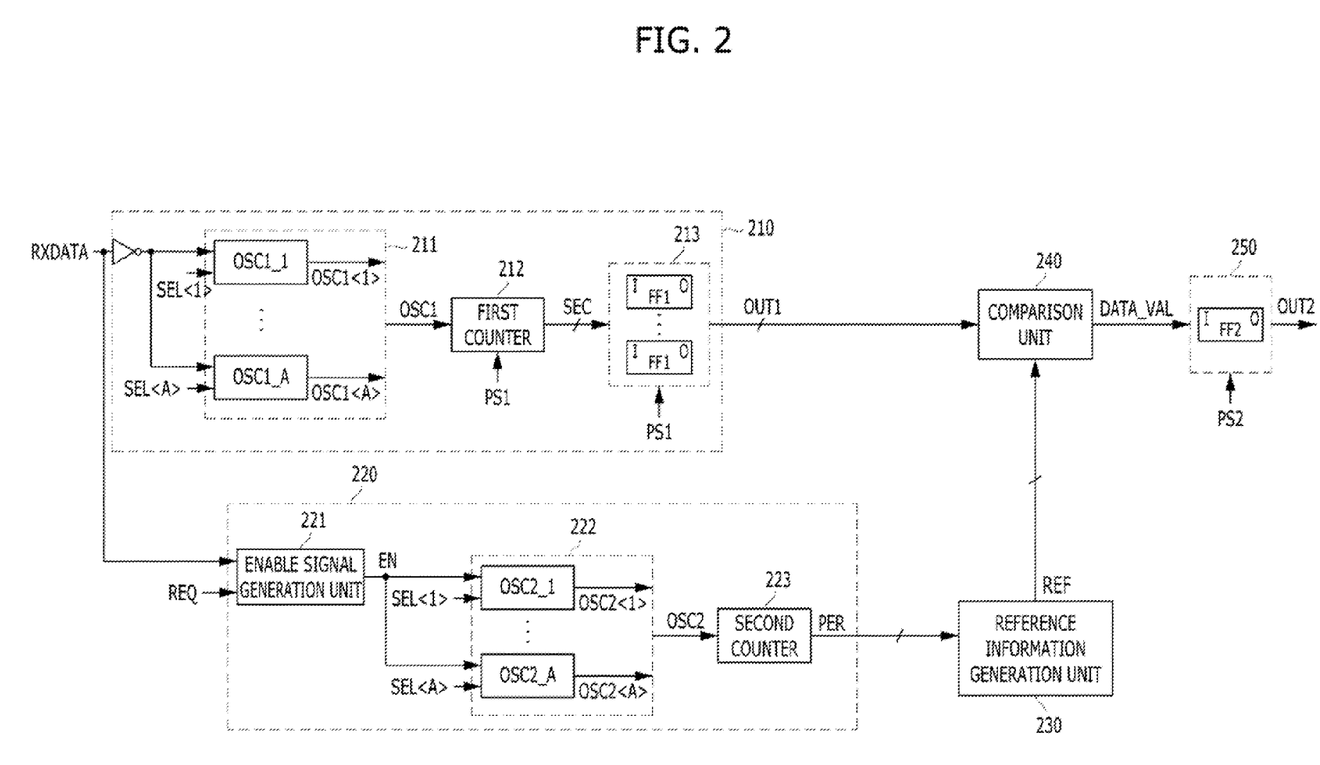
FIG. 2 is a block diagram illustrating a decoding circuit in accordance with an embodiment of the present invention.

FIG. 2 is a block diagram illustrating a decoding circuit in accordance with an embodiment of the present invention.

Referring to FIG. 2, the decoding circuit may include a section information generation unit 210, a period information generation unit 220, a reference information generation unit 230, a comparison unit 240, and a first storage unit 250. The decoding circuit of FIG. 2 may receive an input signal RXDATA once and generate period information PER based on a period of the input signal RXDATA that has been received. The input signal RXDATA may be a PWM signal in which a logic value of data is determined by a length of a section in which the input signal RXDATA has a predetermined value.

The section information generation unit 210 may generate section Information SEC corresponding to a length of a section in which the input signal RXDATA has a first value (hereinafter referred as "low"). The section information generation unit 210 may perform a counting operation during the section in which the input signal RXDATA is low and generate the section Information SEC based on a counting result. The section information generation unit 210 may include a first period signal generation unit 211, a first counter 212, and a second storage unit 213.

The first period signal generation unit 211 may generate a first period signal OSC1 toggling with a predetermined period during the section in which the input signal RXDATA is low. The first period signal generation unit 211 may control a period of the first period signal OSC1 based on a frequency of the input signal RXDATA. The period of the first period signal OSC1 may be shortened as the frequency of the input signal RXDATA is increased, and the period of the first period signal OSC1 may be lengthened as the frequency of the input signal RXDATA is decreased.

The first period signal generation unit 211 may include a plurality of first oscillators OSC1_1 to OSC_A, A being a natural number greater than 1. Each of the plurality of first oscillators OSC1_1 to OSC1_A may be selected when a corresponding one of a plurality of selection signals SEL<1:A> is activated. Preliminary period signals OSC1<1> to OSC1<A> may correspond to the respective oscillators OSC1_1 to OSC1_A. The plurality of first oscillators OSC1_1 to OSC1_A may generate the preliminary period signals OSC1<1> to OSC1<A> toggling with different periods. For example, the periods of the preliminary period signals OSC1<1> to OSC1<A> may be gradually increased from OSC1<1> to OSC1<A>. In this case, as the frequency of the input signal RXDATA is increased, an oscillator that has a short period may be selected from the first oscillators OSC1_1 to OSC1_A. As the frequency of the input signal RXDATA is increased, an oscillator that has a long period may be selected from the first oscillators OSC1_1 to OSC1_A.

A selected first oscillator of the plurality of first oscillators OSC1_1 to OSC1_A may activate a corresponding preliminary period signal in the section in which the input signal RXDATA is low. The preliminary period signal corresponding to the selected first oscillator may be transferred as the first period signal OSC1. Accordingly, the first period signal OSC1 may have the same period as the preliminary period signal corresponding to the selected first oscillator.

The first counter 212 may perform a counting operation in response to the first period signal OSC1. The first counter 212 may count the toggling number of the first period signal OSC1 and generate the section information SEC based on a counting result. The section information SEC may be a digital signal of multiple bits indicative of the toggling number of the first period signal OSC1. The first counter 212 may be reset in response to a first pulse signal PS1 activated in response to a falling edge of the input signal RXDATA. In this case, when the first counter 212 is reset, the counting result of the first counter 212 is set to an initial value.

The second storage unit 213 may store the section information SEC and output a first output signal OUT1 when the first pulse signal PS1 is activated. The second storage unit 213 may include flip-flops FF1 each for storing a value input to its input terminal I and outputting the value to its output terminal O when the first pulse signal PS1 is activated. The flip-flops FF1 may store and output the respective bits of the section information SEC.

The period signal generation unit 220 may generate the period information PER corresponding to the period of the input signal RXDATA. The period signal generation unit 220 may receive the input signal RXDATA once and generate the period information PER corresponding to a length of the period of the input signal RXDATA. The period signal generation unit 220 may include an enable signal generation unit 221, a second period signal generation unit 222, and a second counter 223.

When a request signal REQ to generate the period Information PER is received, the enable signal generation unit 221 may generate an enable signal EN that is activated from a first edge (hereinafter referred to as a "falling edge") of the input signal RXDATA to a next first edge. A section from the falling edge of the input signal RXDATA to the next falling edge may correspond to a section in which data of 1 bit is transferred in the input signal RXDATA.

The second period signal generation unit 222 may generate a second period signal OSC2 toggling with a predetermined period during a section in which the enable signal EN is activated. The second period signal generation unit 222 may control a period of the second period signal OSC2 based on the frequency of the input signal RXDATA. The period of the second period signal OSC2 may be shortened as the frequency of the input signal RXDATA is increased, and the period of the second period signal OSC2 may be lengthened as the frequency of the input signal RXDATA is decreased.

The second period signal generation unit 222 may include a plurality of second oscillators OSC2_1 to OSC2_A. Each of the plurality of second oscillators OSC2_1 to OSC2_A may be selected when a corresponding one of the plurality of selection signals SEL<1:A> is activated. Preliminary period signals OSC2<1> to OSC2<A> may correspond to the respective second oscillators OSC2_1 to OSC2_A. The plurality of second oscillators OSC2_1 to OSC2_A may generate the preliminary period signals OSC2<1> to OSC2<A> toggling with different periods. For example, the periods of the preliminary period signals OSC2<1> to OSC2<A> may be gradually increased from OSC2<1> to OSC2<A>. In this case, as the frequency of the input signal RXDATA is increased, an oscillator that has a short period may be selected from the second oscillators OSC2_1 to OSC2_A. As the frequency of the input signal RXDATA is increased, an oscillator that has a long period may be selected from the second oscillators OSC2_1 to OSC2_A.

A selected second oscillator of the plurality of second oscillators OSC2_1 to OSC2_A may activate a corresponding preliminary period signal in the section in which the enable signal EN has been activated. The preliminary period signal corresponding to the selected second oscillator may be transferred as the second period signal OSC2. Accordingly, the period of the second period signal OSC2 may be the same as that of the preliminary period signal corresponding to the selected second oscillator.

The second counter 223 may perform a counting operation in response to the second period signal OSC2. The second counter 223 may count the toggling number of the second period signal OSC2 and generate the period information PER based on a counting result. The period information PER may be a digital signal of multiple bits indicative of the toggling number of the second period signal OSC2.

The reference information generation unit 230 may generate reference information REF by dividing a value of the period information PER by a predetermined value M, M being a natural number. The reference information REF may have a value obtained by dividing the value of the period information PER by M, that is, PER/M (REF=PER/M). The reference information generation unit 230 may store and output the calculated reference information REF.

The comparison unit 240 may determine a logic value of the input signal RXDATA and output a data value signal DATA_VAL by comparing the section information SEC with the reference information REF. When a value of the section information SEC is greater than the value of the reference information REF, the comparison unit 240 may determine the logic value of the input signal RXDATA to be a first logic value (hereinafter referred to as "low"). When the value of the section information SEC is equal to or less than the value of the reference information REF, the comparison unit 240 may determine the logic value of the input signal RXDATA to be a second logic value (hereinafter referred to as "high"). When M is set to 2, the value of the reference information REF is half the value of the period information PER. Thus, the value of the reference information REF corresponds to a length half of the period of the input signal RXDATA.

Accordingly, when the value of the section information SEC is greater than the value of the reference information REF, it means that the length of the section in which the input signal RXDATA is low is longer than half the length of the period of the input signal RXDATA. Accordingly, the comparison unit 240 may determine the logic value of the input signal RXDATA to be low. Furthermore, when the value of the section information SEC is equal to or less than the value of the reference information REF, it means that the length of the section in which the input signal RXDATA is low is equal to or shorter than the length half of the period of the input signal RXDATA. Accordingly, the comparison unit 240 may determine the logic value of the input signal RXDATA to be high.

The first storage unit 250 may store the data value signal DATA_VAL output from the comparison unit 240 and output a second output signal OUT2 in response to a second pulse signal PS2 activated in response to the falling edge of the input signal RXDATA. The first storage unit 250 may include a flip-flop FF2 for storing a value input to its input terminal I and outputting the value to its output terminal O when the second pulse signal PS2 is activated.

Figure 3:
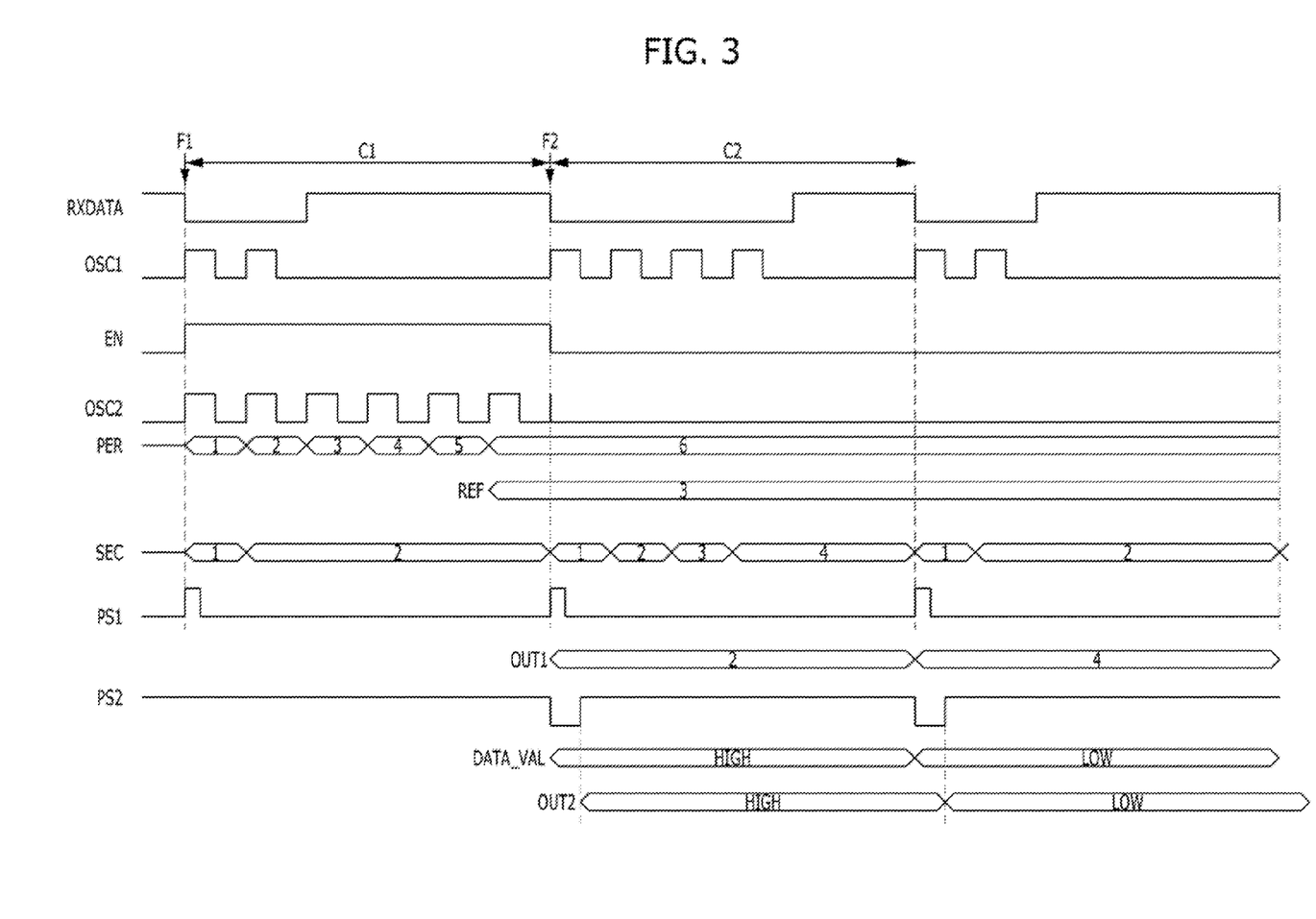
FIG. 3 is a waveform diagram illustrating an operation of the decoding circuit of FIG. 2.

FIG. 3 is a waveform diagram illustrating an operation of the decoding circuit of FIG. 2.

Referring to FIG. 3, the input signal RXDATA may be input consecutively to transfer data of 1 bit. In the section in which the input signal RXDATA is low, the first period signal OSC1 may toggle and the section information SEC may be generated by counting the toggling number of the first period signal OSC1. When the enable signal EN is activated from the falling edge F1 of the input signal RXDATA to the falling edge F2, the second period signal OSC2 may toggle, and the period information PER may be generated by counting the toggling number of the second period signal OSC2. The reference information REF may be generated by dividing the value of the period information PER by 2. Thereafter, the reference information REF may maintain the same value. In FIG. 3, the value of the period information PER is 6, and the value of the reference information REF is 3.

After the reference information REF is generated, the logic value of the input signal RXDATA may be determined by comparing the section information SEC with the reference information REF. In the first period C1, the data value signal DATA_VAL may have a high value because the value of the section information SEC, that is, 2, is smaller than the value of the reference information REF. In the second period C2, the data value signal DATA_VAL may have a low value because the value of the section information SEC, that is, 4, is greater than the value of the reference information REF.

The decoding circuit of FIG. 2 may directly measure the period of the input signal RXDATA, may generate the reference information REF that determines the logic value of data based on a measurement result, and may decode the input signal RXDATA based on the reference information, thereby improving decoding accuracy.

Figure 4:
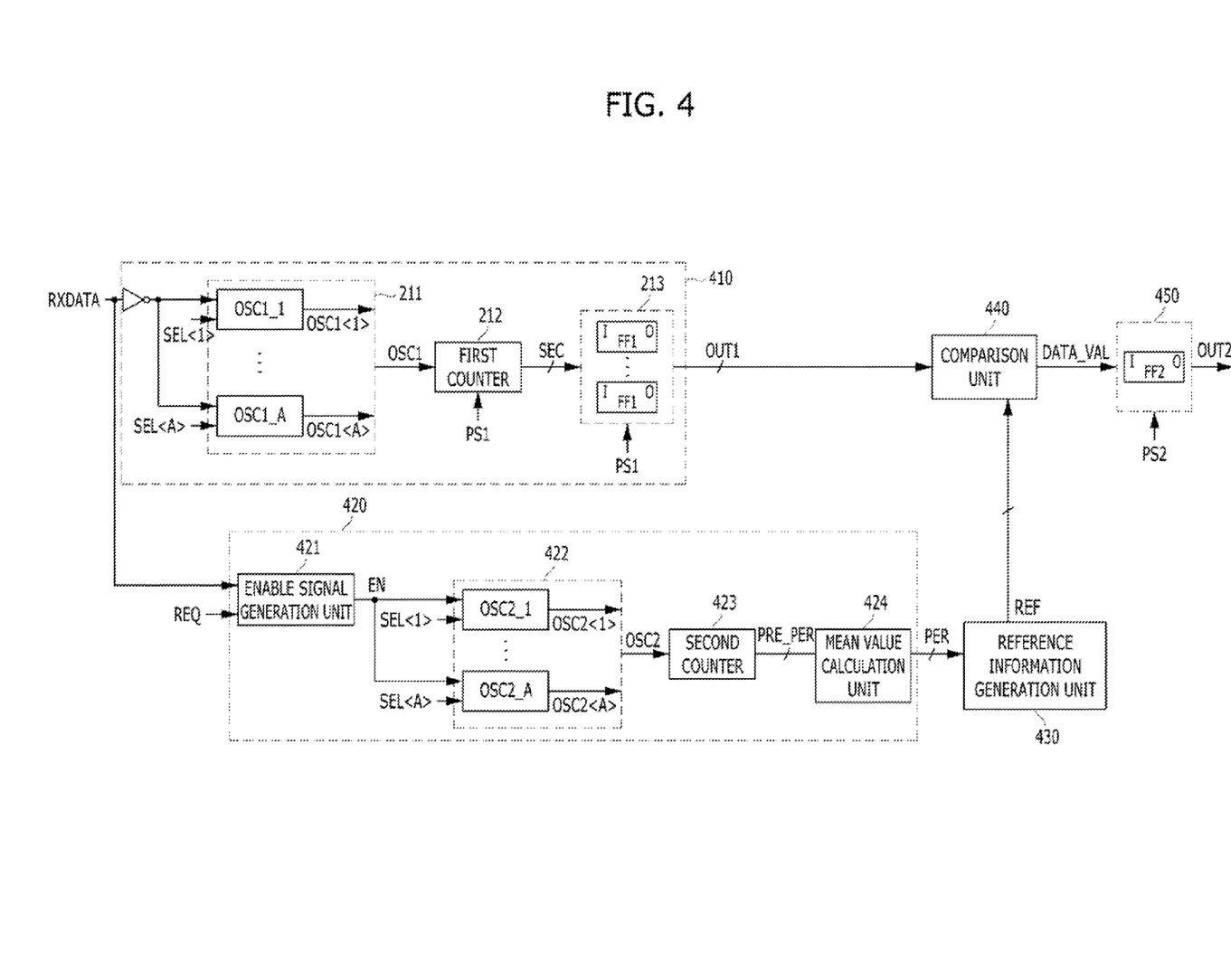
FIG. 4 is a block diagram illustrating a decoding circuit in accordance with an embodiment of the present invention.

FIG. 4 is a block diagram illustrating a decoding circuit in accordance with an embodiment of the present invention.

Referring to FIG. 4, the decoding circuit may include a section information generation unit 410, a period information generation unit 420, a reference information generation unit 430, a comparison unit 440, and a storage unit 450. The decoding circuit of FIG. 4 may receive an input signal RXDATA N times and generate period information PER based on a mean period of the input signal RXDATA that has been input N times. Herein, N is a positive integer greater than 2. The input signal RXDATA may be a PWM signal in which a logic value of data is determined by a length of a section in which the input signal RXDATA has a predetermined value.

The section information generation unit 410, the reference information generation unit 430, the comparison unit 440, and the storage unit 450 may have the same configurations and operations as the section information generation unit 210, the reference information generation unit 230, the comparison unit 240, and the first storage unit 250 of FIG. 2, respectively.

The period signal generation unit 420 may generate the period information PER corresponding to the period of the input signal RXDATA. The period signal generation unit 420 may receive the input signal RXDATA N times and generate the period information PER corresponding to a length of the mean period of the input signal RXDATA that has been input N times. The period signal generation unit 420 may include an enable signal generation unit 421, a second period signal generation unit 422, a second counter 423, and a mean value calculation unit 424.

When a request signal REQ to generate the period information PER is received, the enable signal generation unit 421 may generate an enable signal EN activated from a first edge (hereinafter referred to as a "falling edge") of the input signal RXDATA to an $N^{th}$ first edge. A section from the falling edge of the input signal RXDATA to the $N^{th}$ falling edge may correspond to a time that is taken for data of N bits to be transmitted through the input signal RXDATA.

The second period signal generation unit 422 may generate a second period signal OSC2 toggling with a predetermined period during the section in which the enable signal EN is activated. The second period signal generation unit 422 may control a period of the second period signal OSC2 based on a frequency of the input signal RXDATA. The period of the second period signal OSC2 may be shortened as the frequency of the input signal RXDATA is increased, and the period of the second period signal OSC2 may be lengthened as the frequency of the input signal RXDATA is decreased.

The second period signal generation unit 422 may include a plurality of second oscillators OSC2_1 to OSC2_A, A being a natural number greater than 1. Each of the plurality of second oscillators OSC2_1 to OSC2_A may be selected when a corresponding one of a plurality of selection signals SEL<1:A> is activated. Preliminary period signals OSC2<1> to OSC2<A> may correspond to the respective second oscillators OSC2_1 to OSC2_A. The plurality of second oscillators OSC2_1 to OSC2_A may generate the preliminary period signals OSC2<1> to OSC2<A> toggling with different periods. For example, the periods of the preliminary period signals OSC2<1> to OSC2<A> may gradually increase from OSC2<1> to OSC2<A>. In this case, an oscillator that has a short period may be selected from the second oscillators OSC2_1 to OSC2_A as the frequency of the input signal RXDATA is increased, and an oscillator that has a long period may be selected from the second oscillators OSC2_1 to OSC2_A as the frequency of the input signal RXDATA is decreased.

A selected second oscillator of the plurality of second oscillators OSC2_1 to OSC2_A may activate a corresponding preliminary period signal in the section in which the enable signal EN has been activated. The preliminary period signal corresponding to the selected second oscillator may be transferred as the second period signal OSC2. Accordingly, the second period signal OSC2 may have the same period as the preliminary period signal corresponding to the selected second oscillator.

The second counter 423 may perform a counting operation in response to the second period signal OSC2. The second counter 423 may count the toggling number of the second period signal OSC2 and generate preliminary period information PRE_PER based on a counting result. The preliminary period information PRE_PER may be a digital signal of multiple bits indicative of the toggling number of the second period signal OSC2. The mean value calculation unit 424 may generate the period information PER by dividing a value of the preliminary period information PRE_PER by N.

The decoding circuit of FIG. 4 may further improve decoding accuracy because it receives the input signal RXDATA two or more times and generates the reference information using the mean period of the received input signals RXDATA.

Figure 5:
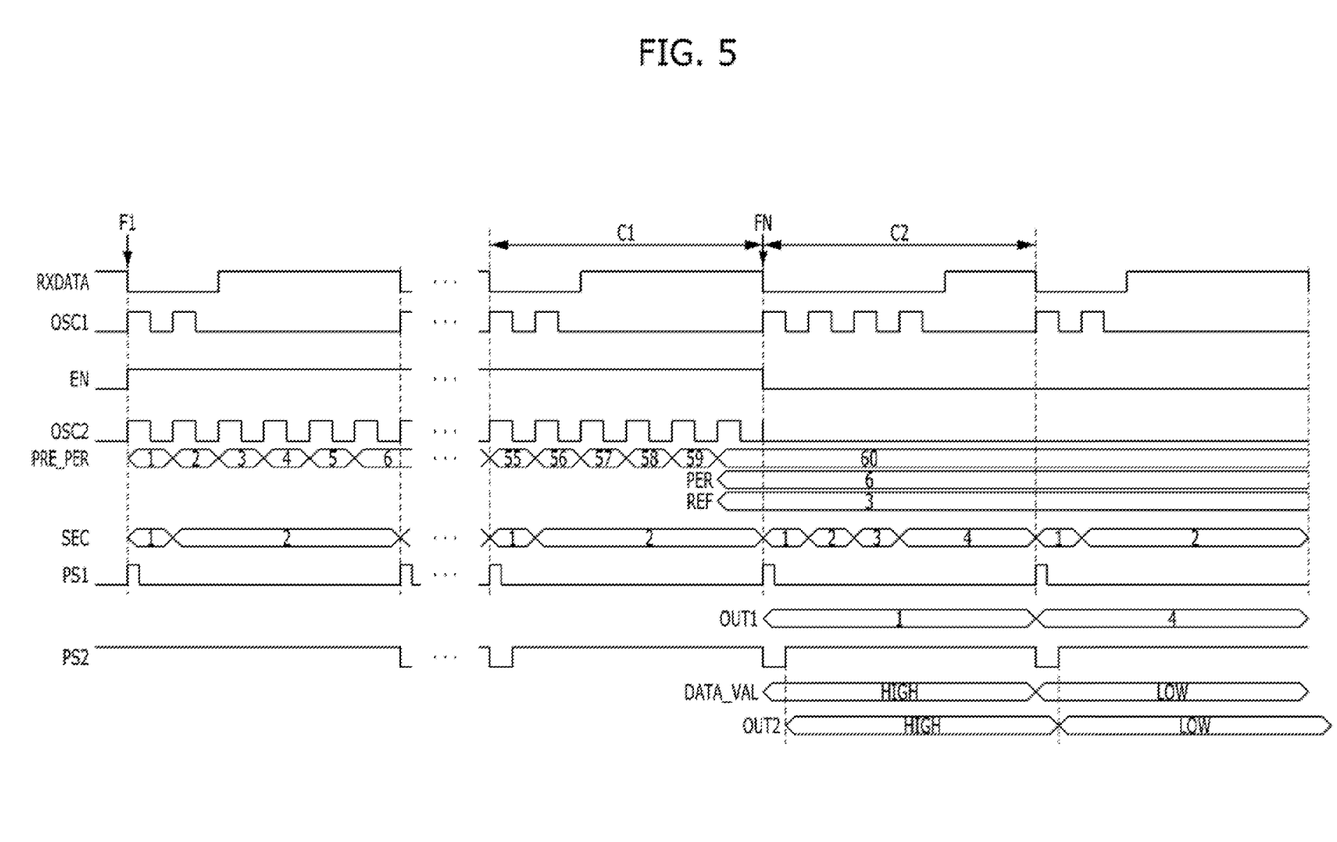
FIG. 5 is a waveform diagram illustrating an operation of the decoding circuit of FIG. 4.

FIG. 5 is a waveform diagram illustrating an operation of the decoding circuit of FIG. 4.

Referring to FIG. 5, it is assumed that the input signal RXDATA may be input consecutively to transfer data of 10 bits. In the section in which the input signal RXDATA is low, a first period signal OSC1 may toggle, and the section information SEC may be generated by counting the toggling number of the first period signal OSC1. When the enable signal EN is activated from the falling edge F1 of the input signal RXDATA to the 10th falling edge F10, the second period signal OSC2 may toggle. When the second period signal OSC2 toggles, the preliminary period Information PRE_PER may be generated by counting the toggling number of the second period signal OSC2. Further, the period information PER may be generated by dividing the value of the preliminary period information PRE_PER by 10, and the reference information REF may be generated by dividing a value of the period information PER by 2. Thereafter, the reference information REF may maintain the same value. In FIG. 5, the value of the preliminary period information PER has been illustrated as being 60, the value of the period information PER is 6, and a value of the reference information REF is 3.

After the reference information REF is generated, the logic value of the input signal RXDATA may be determined by comparing the section information SEC with the reference information REF. In the first period C1, a data value signal DATA_VAL may have a high value because a value of the section information SEC, that is, 2, is greater than the value of the reference information REF. In the second period C2, the data value signal DATA_VAL may have a low value because the value of the section information SEC, that is, 4, is greater than the value of the reference information REF.

The decoding circuit of FIG. 4 directly measures the period of the input signal RXDATA, but may receive the input signal RXDATA at least twice, may measure the mean period of the input signals RXDATA, may generate the reference information REF that determines the logic value of data based on a measurement result, and may decode the input signal RXDATA based on the reference information, thereby improving a decoding accuracy.

Figure 6:
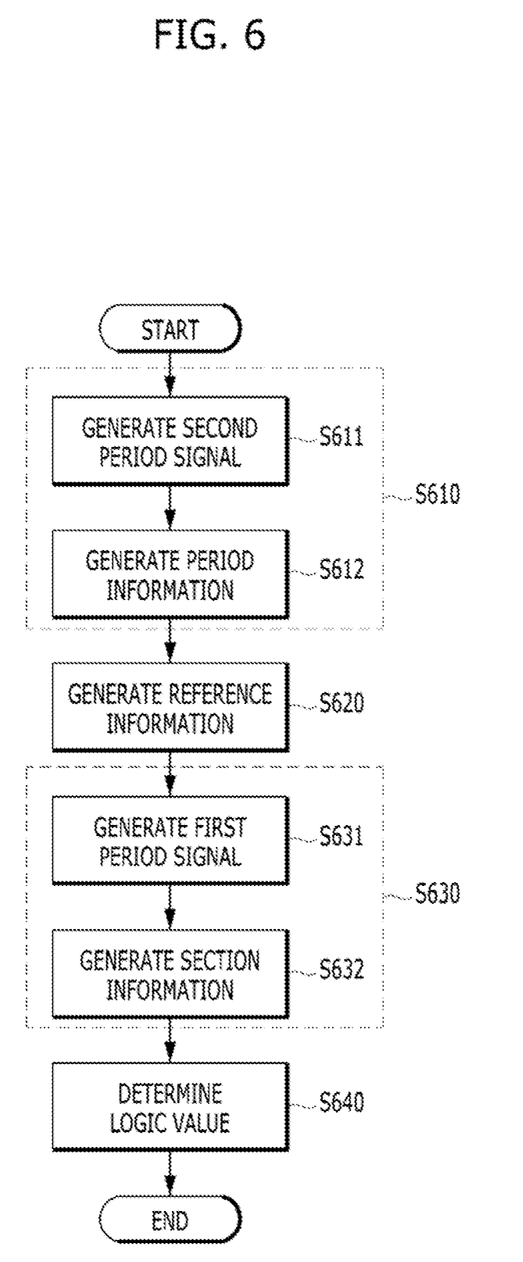
FIG. 6 is a flowchart illustrating a method of decoding a signal in accordance with an embodiment of the present invention.

FIG. 6 is a flowchart illustrating a method of decoding a signal in accordance with an embodiment of the present invention. For reference, FIG. 6 illustrates a method of operating the decoding circuit of FIG. 2.

Referring to FIG. 6, the method of decoding the signal may include generating period information at step S610, generating reference information at step S620, generating section information at step S630, and determining a logic value at step S640.

At step S610 of generating period information, the input signal RXDATA may be received once, and the period information PER corresponding to the length of the period of the input signal RXDATA may be generated. Step S610 of generating period information may include generating the second period signal OSC2 toggling with a predetermined period during a section between two adjacent first edges of the input signal RXDATA at step S611 and generating the period information PER by counting the toggling number of the second period signal OSC2 at step S612.

At step S620 of generating reference information, the reference information REF may be generated by dividing the value of the period information PER by a predetermined value.

At step S630 of generating section information, the section information SEC corresponding to the length of the section in which the input signal RXDATA has a first value may be generated. Step S630 of generating section information may include generating the first period signal OSC1 toggling with a predetermined period during the section in which the input signal RXDATA has the first value at step S631 and generating the section information SEC by counting the toggling number of the first period signal OSC1 at step S632.

At step S640 of determining a logic value, the logic value of the input signal RXDATA may be determined by comparing the section information SEC with the reference information REF. When the value of the section information SEC is greater than the value of the reference information REF, the logic value of the input signal RXDATA may be determined to be a first logic value (hereinafter referred to as "low"). When the value of the section information SEC is equal to or less than the value of the reference information REF, the logic value of the input signal RXDATA may be determined to be a second logic value (hereinafter referred to as "high"). When M is set to 2, a value indicated by the reference information REF corresponds to half the length of the period of the input signal RXDATA because the value of the reference information REF is half of the value of the period information PER.

Figure 7:
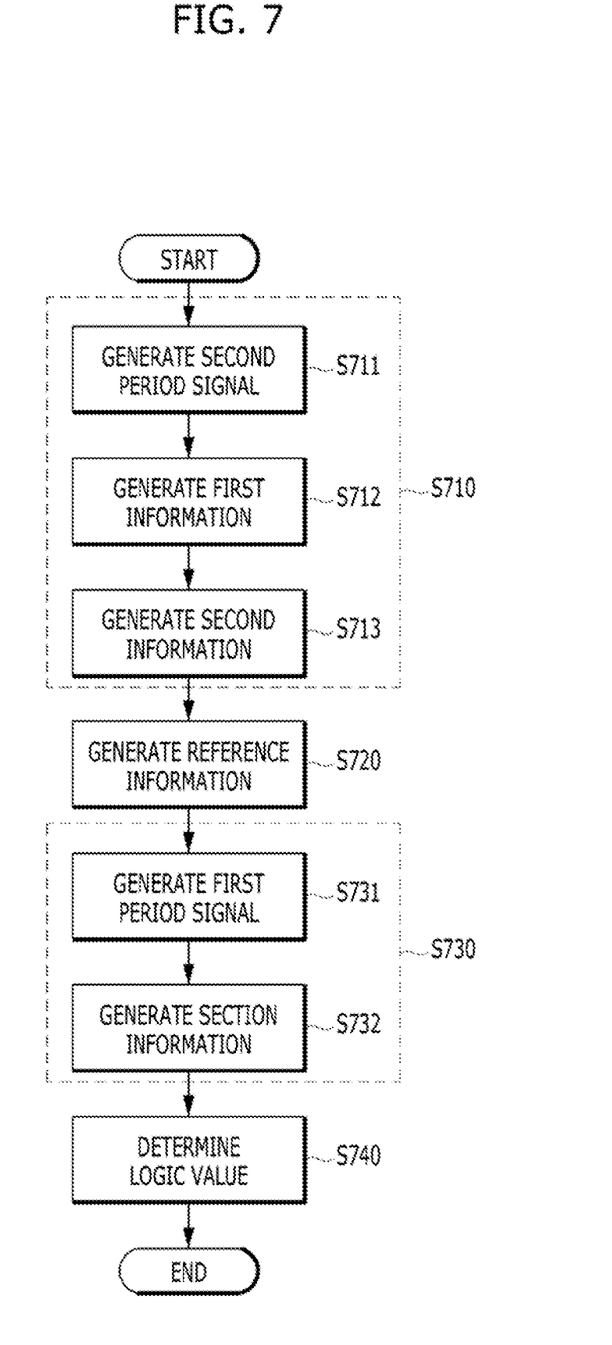
FIG. 7 is a flowchart illustrating a method of decoding a signal in accordance with an embodiment of the present invention.

FIG. 7 is a flowchart illustrating a method of decoding a signal in accordance with an embodiment of the present invention. For reference, FIG. 7 illustrates a method of operating the decoding circuit of FIG. 4.

Referring to FIG. 7, the method of decoding the signal may include generating period information at step S710, generating reference information at step S720, generating section information at step S730, and determining a logic value at step S740. Step S720 of generating reference information, steps S731 and S732 included in step S730 of generating section information, and step S740 of determining a logic value in the method of decoding the signal of FIG. 7 may be respectively the same as step S620 of generating reference information, steps S631 and S632 included in step S630 of generating section Information, and step S640 of determining a logic value in the method of decoding the signal of FIG. 6.

At step S710 of generating period information, the input signal RXDATA may be received N times, and the period information PER corresponding to the length of the mean period of the input signals RXDATA that have been input N times may be generated. Step S710 of generating period information may include generating the second period signal OSC2 toggling with a predetermined period during the section from a first edge of the input signal RXDATA to an Nth first edge while the input signal RXDATA is input N times at step S711, generating first information, that is, the preliminary period information PRE_PER, by counting the toggling number of the second period signal OSC2 at step S712, and generating second information, that is, the period information PER, by dividing the value of the preliminary period information PRE_PER by N at step S713.

In accordance with this technology, the decoding circuit may convert an input signal into a digital value more accurately by directly measuring the period of the input signal and determining the logic value of the input signal based on a measurement result.

Although various embodiments have been described for illustrative purposes, it will be apparent to those skilled in the art that various changes and modifications may be made without departing from the spirit and scope of the invention as defined in the following claims.

What is claimed is:

1. A decoding circuit comprising:
   a section information generation unit suitable for generating section information corresponding to a length of a section in which an input signal has a first value;
   a period information generation unit suitable for generating period information corresponding to a length of a period of the input signal;
   a reference information generation unit suitable for generating reference information by dividing a value of the period information by a given value; and
   a comparison unit suitable for determining a logic value of the input signal by comparing the section information with the reference information,
   wherein the section information generation unit comprises:
   a first period signal generation unit suitable for generating a first period signal toggling with a preset period during the section in which the input signal has the first value; and
   a first counter suitable for generating the section information by performing a counting operation in response to the first period signal.

2. The decoding circuit of claim 1, wherein the input signal comprises a pulse width modulation signal.

3. The decoding circuit of claim 1, wherein the preset period of the first period signal is controlled based on a frequency of the input signal.

4. The decoding circuit of claim 1, wherein:
   the first period signal generation unit comprises a plurality of first oscillators suitable for generating first preliminary period signals toggling with different periods, and
   one of the plurality of first oscillators is selected based on a frequency of the input signal, and the preset period of the first period signal is identical to that of the first preliminary period signal of the selected first oscillator.

5. The decoding circuit of claim 1, wherein the period information generation unit receives the input signal once and generates the period information based on the period of the input signal that is input once.

6. The decoding circuit of claim 5, wherein the period information generation unit comprises:

a second period signal generation unit suitable for generating a second period signal toggling with a preset period during a section between adjacent first edges of the input signal; and
a second counter suitable for generating the period information by performing a counting operation in response to the second period signal.

7. The decoding circuit of claim 6, wherein:
   the second period signal generation unit comprises a plurality of second oscillators suitable for generating second preliminary period signals toggling with different periods, and
   one of the plurality of second oscillators is selected based on a frequency of the input signal, and the preset period of the second period signal is identical to that of the preliminary period signal of the selected second oscillator.

8. The decoding circuit of claim 1, wherein the period information generation unit receives the input signal N times, N being an integer greater than 2, and generates the period information based on a mean period of the input signal that is input N times.

9. The decoding circuit of claim 8, wherein the period information generation unit comprises:
   a second period signal generation unit suitable for generating a second period signal toggling with a preset period during a section from a first edge of the input signal to an Nth first edge of the input signal;
   a second counter suitable for generating preliminary period information by performing a counting operation in response to the second period signal; and
   a mean value calculation unit suitable for generating the period information by dividing a value of the preliminary period information by N.

10. The decoding circuit of claim 9, wherein:
    the second period signal generation unit comprises a plurality of second oscillators suitable for generating second preliminary period signals toggling with different periods, and
    one of the plurality of second oscillators is selected based on a frequency of the input signal, and the preset period of the second period signal is identical to that of the preliminary period signal of the selected second oscillator.

11. The decoding circuit of claim 1, wherein the comparison unit determines the logic value of the input signal to be a first logic value when a value of the section information is greater than a value the reference information, and determines the logic value of the input signal to be a second logic value when the value of the section information is equal to or less than the value of the reference information.

12. The decoding circuit of claim 11, wherein,
    when the reference information generation unit generates the reference information by dividing the value of the period information by 2, the comparison unit determines the logic value of the input signal to be the first logic value when the length of the section in which the input signal has the first value is longer than half of the length of the period of the input signal, and determines the logic value of the input signal to be the second logic value when the length of the section in which the input signal has the first value is equal to or shorter than half of the length of the period of the input signal.

13. The decoding circuit of claim 1, further comprising:
    a storage unit suitable for latching the logic value of the input signal output from the comparison unit at a first edge of the input signal.

14. A method of decoding a signal, comprising:
generating period information corresponding to a length of a period of an input signal;
generating reference information by dividing a value of the period information by a given value;
generating section information corresponding to a length of a section in which the input signal has a first value; and
determining a logic value of the input signal by comparing the section information with the reference information
wherein the generating of the section information comprises:
generating a first period signal toggling with a preset period during the section in which the input signal has the first value; and
generating the section information by performing a counting operation in response to the first period signal.

15. The method of claim 14, wherein the input signal comprises a pulse width modulation signal.

16. The method of claim 14, wherein the generating of the period information comprises:
generating a second period signal toggling with a preset period for a time when the input signal is input once; and
generating the period information by performing a counting operation in response to the second period signal.

17. The method of claim 14, wherein the generating of the period information comprises:
generating a second period signal toggling with a preset period for a time when the input signal is input N times, N being an integer greater than 2;
generating preliminary period information by performing a counting operation in response to the second period signal; and
generating the period information by dividing a value of the preliminary period information by N.

18. The method of claim 14, wherein the determining of the logic value of the input signal comprises:
determining the logic value of the input signal to be a first logic value when a value of the section information is greater than a value of the reference information, and
determining the logic value of the input signal to be a second logic value when the value of the section information is equal to or less than the value of the reference information.

* * * * *